United States Patent [19]

Van Hunsel et al.

[11] Patent Number: 5,658,713
[45] Date of Patent: Aug. 19, 1997

[54] CONCENTRATED DAMPENING SOLUTION WITH CITRATE ANIONS FOR PRINTING WITH A LITHOGRAPHIC PRINTING PLATE OBTAINED ACCORDING TO THE SILVER SALT DIFFUSION TRANSFER PROCESS

[75] Inventors: Johan Van Hunsel, Hasselt; Paul Mortelmans, Mortsel, both of Belgium

[73] Assignee: Agfa-Gevaert, N.V., Mortsel, Belgium

[21] Appl. No.: 633,491

[22] Filed: Apr. 17, 1996

[30] Foreign Application Priority Data

May 31, 1995 [EP] European Pat. Off. ............. 95201423

[51] Int. Cl.$^6$ ................ G03F 7/07; G03F 7/26; B41N 3/00
[52] U.S. Cl. .......... 430/331; 430/204; 430/463; 101/451; 101/465; 106/2
[58] Field of Search ................ 430/204, 463, 430/331; 106/2; 101/451, 465

[56] References Cited

U.S. PATENT DOCUMENTS

| | | | |
|---|---|---|---|
| 3,829,319 | 8/1974 | Suzuki et al. | 106/2 |
| 4,238,279 | 12/1980 | Tsubai et al. | 106/2 |
| 4,530,721 | 7/1985 | Kinderman et al. | 430/331 |
| 5,512,412 | 4/1996 | Vaes et al. | 430/204 |
| 5,525,455 | 6/1996 | Kurokawa et al. | 430/204 |
| 5,536,618 | 7/1996 | De Keyzer et al. | 430/204 |
| 5,536,817 | 7/1996 | Michiels et al. | 430/204 |
| 5,587,271 | 12/1996 | Heugebaert et al. | 430/204 |

*Primary Examiner*—Richard L. Schilling
*Attorney, Agent, or Firm*—Breiner & Breiner

[57] ABSTRACT

The present invention provides a concentrated dampening solution for use in a lithographic printing process having a pH between 3 and 6 and comprising a water-soluble organic solvent, a phosphate salt and a transparent pigment in an amount between 1 g/l and 30 g/l, characterized in that said concentrated dampening solution further contains a total concentration of citrate anions between 0.5 mmole and 25 mmole/l.

9 Claims, No Drawings

CONCENTRATED DAMPENING SOLUTION WITH CITRATE ANIONS FOR PRINTING WITH A LITHOGRAPHIC PRINTING PLATE OBTAINED ACCORDING TO THE SILVER SALT DIFFUSION TRANSFER PROCESS

DESCRIPTION

FIELD OF THE INVENTION

The present invention relates to a concentrated dampening solution suitable after dilution for printing with a lithographic printing plate obtained according to the silver salt diffusion transfer process.

Furthermore the present invention relates to a method for printing by using said dampening solution and a lithographic printing plate obtained according to the silver salt diffusion transfer process.

BACKGROUND OF THE INVENTION

Lithographic printing is carried out by feeding both water and oleophilic colored ink to the printing plate surface to allow the image areas to receive preferentially the colored ink and the non-image areas preferentially water and then transferring the ink deposited on image areas onto a substrate such as paper for example. Therefore, in order to obtain a print of good quality, it is necessary that oleophilicity of the image areas and hydrophilicity of the non-image areas are both strong enough so that when water and ink are applied, the image areas may receive sufficient amount of ink while the non-image areas may completely repel the ink. For this purpose, various methods for rendering the non-image areas insensitive to oil have been studied according to the type of printing plate materials and the printing methods.

That is, hitherto, as lithographic printing plate materials, there are presensitized plates (PS plates) with a support of metals such as aluminum, plate materials obtained by electrophotographic process (such as electro fax), so called master papers comprising a paper as substrate coated with a pigment together with a binder and photographic printing plate materials using silver salts as disclosed in Japanese Patent Kokoku No. 48-30562. Plate making methods and printing methods using solutions to render the non-image areas insensitive to oil and dampening solutions suitable for each of these materials have been studied and developed.

Lithographic printing plates which utilize transfer silver images obtained by silver complex diffusion transfer process as ink receptive areas are disclosed in Japanese Patent Kokoku No. 48-30562 and Papanese Patent Kokai Nos. 53-21602, 54-103104 and 56-9750 and are well known The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR-element) or in the image-receiving layer of a so-called single-support element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

According to the preferred embodiment of the mono-sheet DTR-offset printing plate, disclosed in e.g. U.S. Pat. No. 4,722,535 and GB-P-1,241,661, a flexible support e.g. of paper or of an organic resin is provided in the order given with a silver halide emulsion layer and a layer containing physical development nuclei serving as the image-receiving layer. After information-wise exposure and development the imaged element is used as a printing plate without the removal of the now-useless emulsion layers.

Said type of mono-sheet DTR offset printing plates is not compatible with other types of printing plates with regard to dampening solutions. In order that said mono-sheet DTR offset printing plates show no ink acceptance in the non-printing areas (no staining), use should be made of special dampening solutions containing a seizable amount of a transparent pigment usually colloidal siliciumoxide as disclosed e.g. in U.S. Pat. Nos. 3,829,319, 4,238,279 and EP-A 304.662.

For economical reasons (less packaging material, less storage space, a smaller volume to transport) practically all dampening solutions, including the above mentioned dampening solutions are sold in a concentrated form and only diluted at the moment they are used on the printing press.

However, the above mentioned concentrated dampening solutions show a lack of shelf life due to the presence of this transparent pigment in said solutions having typically a pH between 3 and 6. Indeed, the lithographic active transparent pigment, mostly colloidal silica is not stable at said pH but is only stable at an alkaline pH of around 9. Colloidal silica which is stable at a pH below 7 is not lithographic active. In order to keep said dampening solutions homogeneous (which is a metastable situation for said solution) for some time, the presence of a water-soluble organic solvent is required.

The requirement for said dampening solutions of having a pH between 3 and 6 stems from the fact that otherwise said dampening solutions are not compatible with the usual lithographic inks. To maintain the required pH, said dampening solutions has to comprise a buffer because otherwise the pH will vary due to different causes e.g. the dilution with tap water, the contact with the usually alkaline printing paper etc.

As a buffer, citrate salts have been used. However, said dampening solutions comprising citrate salts form by storage a coarcevate and are not longer suitable for use. Also as a buffer, phosphate salts have been used. However storage of said dampening solutions containing phosphate salts results in flocculation or even formation of a sediment of said transparent pigment. This results in a cloudy outlook of the undiluted as well as of the diluted dampening solution. Furthermore, this instability may cause a soiling of the dampening unit of the printing apparatus. Possibly, other parts of the press may also get soiled in due time. When a dampening circulation system is used, which delivers dampening solution to one or several presses, this system is also very prone to get soiled. This soiling of the dampening unit or the dampening circulation system results in the need for a more frequent cleaning of said units (a cumbersome and time-consuming operation). Apart from soiling said instability of said dampening solutions containing phosphate salts may even results in a possible staining in the non-image areas of the printed copies because less active transparent pigment is present in the dampening solution.

SUMMARY OF THE INVENTION

It is an object of the present invention to provide a concentrated dampening solution suitable after dilution for printing with a lithographic printing plate obtained according to the DTR-process having an improved shelf life.

It is a further object of the present invention to provide a method for lithographic printing using the above mentioned concentrated dampening solution and a lithographic printing plate obtained according to the DTR-process.

Still further objects of the present invention will become clear from the description hereinafter.

According to the invention there is provided a concentrated dampening solution for use in a lithographic printing process having a pH between 3 and 6 and comprising a water-soluble organic solvent, a phosphate salt and a transparent pigment in an amount between 1 g/l and 30 g/l, characterized in that said concentrated dampening solution further contains a total concentration of citrate anions between 0.5 mmole and 25 mmole/l.

According to the present invention there is further provided a method for lithographic printing comprising the following steps:

preparing a lithographic printing plate according to the silver salt diffusion transfer process by (1) image-wise exposing an imaging element comprising in the order given on a support a photosensitive layer comprising a silver halide emulsion and an image receiving layer containing physical development nuclei in water permeable relationship with said emulsion layer and (2) developing said imaging element in the presence of developing agent(s) and silver halide solvent(s) using an alkaline processing liquid, mounting said lithographic printing plate to a lithographic printing press, and printing while supplying to said lithographic printing plate a printing ink and a diluted dampening solution obtained from a concentrated dampening solution having a pH between 3 and 6 and comprising a water-soluble organic solvent, a phosphate salt and a transparent pigment in an amount between 1 g/l and 30 g/l, characterized in that said concentrated dampening solution further contains a total concentration of citrate anions between 0.5 mmole and 25 mmole/l and that said concentrated dampening solution is used on the printing press in a 1:100 to 10:100 dilution.

DETAILED DESCRIPTION OF THE INVENTION

According to the present invention it has been found that a concentrated dampening solution suitable for printing with a lithographic printing plate obtained according to the silver salt diffusion transfer process having a pH between 3 and 6 and comprising a water-soluble organic solvent, a phosphate salt and a transparent pigment in an amount between 1 g/l and 30 g/l has an improved shelf life when said concentrated dampening solution further contains a total concentration of citrate anions between 0.5 mmole and 25 mmole/l.

The term "total concentration of citrate anions" represents the sum of the concentrations of citric acid and its salts regardless of their ionic charge.

The total concentration of citrate anions in the concentrated dampening solution is preferably between 1.0 mmole and 20 mole/l, more preferably between 1.5 mmole and 15 mmole/l.

In general, said transparent pigment is a non-water swellable, inorganic fine particle with an average grain diameter of less than 0.05 µm, especially a sol of oxide or hydroxide of a metal belonging to Group III–IV of the periodic table such as colloidal siliciumdioxide and colloidal alumina.

Preferentially said concentrated dampening solution comprises said transparent pigment in an amount between 2.5 g/l and 20 g/l.

Dampening solutions suitable for use in the present invention are aqueous solutions comprising water-soluble organic solvents. Examples of such water-soluble organic solvents include alcohols, polyhydric alcohols, ethers, polyglycols and esters.

Examples of the alcohols include n-butyl alcohol, n-amyl alcohol, n-hexyl alcohol, 2-methylpentanol-1, secondary hexyl alcohol, 2-ethylbutyl alcohol, secondary heptyl alcohol and heptanol-3,2-ethylhexyl alcohol.

Examples of the polyhydric alcohols include ethylene glycol, hexylene glycol, octylene glycol, diethylene glycol and glycerol. Examples of the ethers include ethylene glycol monoethyl ether, ethylene glycol mono-n-hexyl ether, ethylene glycol monophenyl ether, ethylene glycol mono-2-ethylbutyl ether, diethylene glycol monoethyl ether and diethylene glycol mono-n-hexyl ether.

Examples of the esters include diethylene glycol monoethyl ether acetate and diethylene glycol monobutyl ether acetate.

Examples of polyglycols include polyethyleneglycols having an average molecular weight of 400 to 2000, polypropylene glycols having an average molecular weight of 400 to 2000, and block copolymers of ethylene glycol and propylene glycol.

The dynamic surface tension of the dampening solution is lowered by adding said organic solvents. A dampening solution according to the invention has preferably a dynamic surface tension range from 25 to 50 dyne/cm at 15° C. when measured at most $1*10^{-1}$ second after a surface of said solution is formed on the surface of a printing plate with the NOW-INSTANT WILHELMY DYNAMIC SURFACE TENSION ACCESSORY manufactured by Cahn Co, U.S.A.

The dampening solutions used in the present invention may contain from about 0.05 to 30%, preferably from 0.1 to 25%, more preferably from 1 to 20% by weight of these water-soluble organic solvents.

According to the invention the dampening solutions have a pH comprised between 3 and 6, more preferably between 4 and 6. Therefore said concentrated dampening solution comprises, in addition to the citrate salt a phosphate salt i.c. $NaH_2PO_4$ as a buffer. The amount of the phosphate salt, expressed as $NaH_2PO_4$ lies preferably between 4 and 30 g/l, more preferably between 6 and 25 g/l.

Surfactants can be added to the dampening solution to increase the emulsification ratio in ink. The contents of these surfactants should not be higher than 1% by weight preferably 0.0001 to 0.3% by weight when foaming is taken into consideration.

The dampening solution used in the present invention may also comprise thickening agents. Examples of thickening agents which can be used in the present invention include water-soluble cellulose derivatives, alginate and derivatives, gum, water-soluble modifications of starch, and water-soluble high-molecular homopolymers and copolymers. These compounds may be used either alone or as a mixture of two or more of them.

The concentration varies depending on the type of the thickening agents, but is preferably about 0.00005 to 1% by weight based on the amount of the dampening solution composition.

In general, the dampening solution used in the present invention comprises a (combination of) preservative(s), so that the composition is effective for controlling various kinds of mold, bacteria and yeast.

In addition to the above-described components, the dampening solution of the present invention may contain chelate compounds preferably in an amount of 0.00001 to 0.3% by weight based on the amount of the dampening solution and corrosion inhibitors preferably in an amount of 0.000001 to 0.5% by weight.

The concentrated dampening solution as described above is diluted with sufficient tap water or well water prior to being applied on the plate. The concentrated dampening solution is used on the printing press in a 1:100 to 10:100 dilution, preferably in a 2:100 to 6:100 dilution.

The dampening solution can be used alone or in combination with water-soluble organic solvents e.g. isopropanol or substitutes therefore.

According to the present invention a lithographic printing plate is obtained by means of the DTR-process using an imaging element comprising on a support in the order given a silver halide emulsion layer and a layer containing physical development nuclei in water permeable relationship with said emulsion layer.

Layers being in waterpermeable contact with each other are layers that are contiguous to each other or only separated from each other by (a) waterpermeable layer(s). The nature of a water-permeable layer is such that it does not substantially inhibit or restrain the diffusion of water or of compounds contained in an aqueous solution e.g. developing agents or the complexed silver.

Supports suitable for use in accordance with the present invention may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The image receiving layer containing physical development nuclei is preferably free of hydrophilic binder but may comprise amounts upto 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The silver halide emulsion for use in connection with the present invention is a silver chlorobromide emulsions that contain silver bromide in the range from 0.1 mole % to 40 mole % and that may contain upto 2 mole % of silver iodide. Preferably, the amount of silver bromide is between 1 mole % and 30 mole %. An emulsion comprising more than 5 mole % of silver bromide preferably belongs to the core/shell type well known to those skilled in the art in the sense that substantially all the bromide is concentrated in the core. This core contains preferably 10 to 40% of the total silver halide precipitated, while the shell consist preferably of 60 to 90% of the total silver precipitated. A particularly preferred silver halide emulsion of this type is described in U.S. Pat. No. 5,059,508.

The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment said base-layer serves as an antihalation layer. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with this photographic material a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents, anionic agents comprising an acid group, ampholytic agents and cationic agents. Preferably compounds containing perfluorinated alkyl groups are used.

This photographic material suitable for use in the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

The imaging element according to the present invention may be imaged by means of a wide choice of cameras existing on the market. Horizontal, vertical and darkroom type cameras and contact-exposure apparatus are available to suit any particular class of reprographic work. The imaging element can also be exposed in accordance with the present invention with the aid of i.a. laser recorders and cathode ray tubes.

Subsequently, said photographic material is developed with the aid of an aqueous alkaline solution in the presence of (a) developing agent(s) and (a) silver halide solvent(s).

The alkaline processing liquid used for developing the imaging element in accordance with the method of the present invention preferably contains a silver halide solvent. Preferably the silver halide solvent is used in an amount between 0.01% by weight and 10% by weight and more preferably, between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

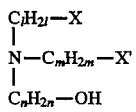

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

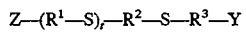

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m$^2$, more preferably between 0.1 and 0.5 mmol/m$^2$ and most preferably between 0.5 and 1.5 mmol/m$^2$. More details are disclosed in EP-A-0.554,585

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material, preferably in the silver halide emulsion layer of the photographic material, in an amount of less than 150 mg/g of silver halide expressed as AgNO$_3$, more preferably in an amount of less than 100 mg/g of silver halide expressed as AgNO$_3$.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Preferred hydrophobizing agents are mercapto-1,3,4-thiadiazoles as described in DE-A 1,228,927 and in U.S. Pat. No. 4,563,410, 2-mercapto-1,3,4-oxadiazoles, 3-mercapto-1,2,4-triazoles and long chain (at least 5 carbon atoms) alkyl substituted mercaptotetrazoles. The hydrophobizing agents can be used alone or in combination with each other. Particularly preferred compounds correspond to one of the following formulas:

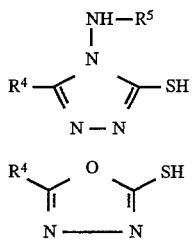

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos. 3,038,805 - 4,038,075 - 4,292,400 - 4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic/hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

In accordance with the present invention in a following step the lithographic plate is mounted on a lithographic press and treated with a diluted dampening solution as described above and with a lithographic ink in order to print.

Any of the conventional lithographic inks can be used in the present invention. Examples of the lithographic inks include black ink, general process color ink, pantone color ink, magnetic ink, gold and silver ink, UV curable ink, ink for synthetic paper, fluoresent ink and metallic ink etc.

The dampening system suitable for use in the present invention is preferably an integrated system, whereby the dampening solution and the ink are brought into contact with each other before applying them to the lithographic plate e.g. by feeding the dampening solution to inked rollers. The dampening system used in the present invention may also be a conventional separated system, whereby the dampening solution is fed to the lithographic plate using fabric covered rollers independent of the inked rollers. Also hybrid dampening systems may be used in the present invention, whereby some dampening solution is brought into contact with the ink before applying the mixture to the lithographic plate and some dampening solution is fed directly to the lithographic plate using rubber rollers independent of the inked rollers.

As printing press any lithographic printing press can be used.

Printing can be effected on any ink-receptive element i.a. depending on the required printing effect. In general, paper is used but also cardboard can be used.

The following examples illustrate the present invention without limiting it thereto. All percentages are by weight unless stated otherwise.

EXAMPLE 1

A concentrated dampening solution I was prepared by adding to 700 ml of demineralized water 12 g of $NaH_2PO_4.2H_2O$, 7 ml of a 5% solution of 5-bromo-5-nitro-1,3-dioxane, 130 ml of dipropylene glycol, 20 ml of a 30% solution of colloidal silica with a specific surface of 300 $m^2$/g, and water to make 1000 ml. The pH of said concentrated dampening solution was adjusted to 5.6 by adding the necessary amount of a solution of 40% of NaOH.

Concentrated dampening solutions II to V were prepared in an identical way except that supplementary was added 2.5 mmole (concentrated dampening solution II), 5.0 mmole (concentrated dampening solution III), 25 mmole (concentrated dampening solution IV) and 50 mmole (concentrated dampening solution V) of citric acid, adjusting the pH to 5.6 by adding the necessary amount of a solution of 40% of NaOH and the total volume to 1000 ml. All concentrated dampening solutions were clear transparent solutions.

The concentrated dampening solutions were then stored in a sealed bottle for 14 days at 60° C. and then visually evaluated. The results are given in Table 1.

TABLE 1

| Damp. sol. | Citrate (mmole/l) | Storage 14 days 60° C. |
|---|---|---|
| I | 0 | fine deposit |
| II | 2.5 | clear transparent solution |
| III | 5 | clear transparent solution |
| IV | 25 | slightly cloudy solution |
| V | 50 | cloudy-two phases |

It is clear that the concentrated dampening solutions II to IV (solutions according to the invention) were (practically) stable by storage while the concentrated dampening solutions I and V (comparison solutions) were unstable and no longer fit for use after storage.

EXAMPLE 2

A concentrated dampening solution VI was prepared by adding to 700 ml of demineralized water 12 g of $NaH_2PO_4.2H_2O$, 7 ml of a 5% solution of 5-bromo-5-nitro-1,3-dioxane, 130 ml of dipropylene glycol, 50 ml of a 30% solution of colloidal silica with a specific surface of 300 $m^2/g$, and water to make 1000 ml. The pH of said concentrated dampening solution was adjusted to 5.6 by adding the necessary amount of a solution of 40% of NaOH.

Concentrated dampening solutions VII to X were prepared in an identical way except that supplementary was added 2.5 mmole (concentrated dampening solution VII), 5.0 mmole (concentrated dampening solution VIII), 25 mmole (concentrated dampening solution IX) and 50 mmole (concentrated dampening solution X) of citric acid, adjusting the pH to 5.6 by adding the necessary amount of a solution of 40% of NaOH and the total volume to 1000 ml. All concentrated dampening solutions were clear transparent solutions.

The concentrated dampening solutions were then stored in a sealed bottle for 14 days at 60° C. and then visually evaluated. The results are given in Table 2.

TABLE 2

| Damp. sol | Citrate (mmole/l) | Storage 14 days 60° C. |
|---|---|---|
| VI | 0 | fine deposit |
| VII | 2.5 | almost clear solution |
| VIII | 5 | slightly cloudy solution |
| IX | 25 | cloudy solution |
| X | 50 | very cloudy-very viscous solution |

It is clear that the concentrated dampening solutions VII to IX (solutions according to the invention) were relatively stable by storage while the concentrated dampening solutions VI and X (comparison solutions) were unstable and no longer fit for use after storage.

We claim:

1. A concentrated dampening solution for use in a lithographic printing process being an aqueous solution having a pH between 3 and 6 and comprising a water-soluble organic solvent, a phosphate salt and a transparent pigment in an amount between 1 g/l and 30 g/l, characterized in that said concentrated dampening solution further contains a total concentration of citrate anions between 0.5 mmole and 25 mmole/l.

2. A concentrated dampening solution according to claim 1 wherein said total concentration of citrate anions lies between 1.0 mmole and 20 mmole/l.

3. A concentrated dampening solution according to claim 2 wherein said total concentration of citrate anions lies between 1.5 mmole and 15 mmole/l.

4. A concentrated dampening solution according to claim 1 wherein said transparent pigment is a non-water swellable, inorganic fine particle with an average grain diameter of less than 0.05 μm.

5. A concentrated dampening solution according to claim 4 wherein said transparent pigment is a sol of oxide or hydroxide of a metal belonging to Group III–IV of the periodic table.

6. A concentrated dampening solution according to claim 1 wherein said transparent pigment is comprised in an amount between 2.5 g/l and 20 g/l.

7. A concentrated dampening solution according to claim 1 wherein said concentrated dampening solution contains from about 0.05 to 30% by weight of said water-soluble organic solvents.

8. A concentrated dampening solution according to claim 1 wherein said concentrated dampening solution comprises phosphate salt, expressed as $NaH_2PO_4$ between 4 and 30 g/l.

9. A concentrated dampening solution according to claim 1 wherein said concentrated dampening solution comprises phosphate salt, expressed as $NaH_2PO_4$ between 6 and 25 g/l.

* * * * *